United States Patent [19]

Kuroda et al.

[11] Patent Number: 4,945,446
[45] Date of Patent: Jul. 31, 1990

[54] MAGNETIC FIELD COMPENSATING APPARATUS

[75] Inventors: Shigenori Kuroda; Moriaki Takechi, both of Hyogo, Japan

[73] Assignee: Mitsubishi Denki Kabushiki Kaisha, Tokyo, Japan

[21] Appl. No.: 209,971

[22] Filed: Jun. 22, 1988

[30] Foreign Application Priority Data

Jun. 23, 1987 [JP] Japan ................. 62-154568

[51] Int. Cl.$^5$ ............................. H01H 47/00
[52] U.S. Cl. ..................... 361/146; 361/19; 361/141; 324/225
[58] Field of Search ............... 361/19, 141, 143, 146; 335/216; 324/225

[56] References Cited

U.S. PATENT DOCUMENTS

| 3,582,779 | 6/1971 | Bloom ................................. 361/146 |
| 4,680,551 | 7/1987 | O'Donnell et al. ................. 324/320 |
| 4,700,136 | 10/1987 | Yamaguchi et al. ............... 361/141 |
| 4,740,772 | 4/1988 | Prevot ................................ 324/320 |
| 4,812,797 | 3/1989 | Jayakumar ....................... 324/320 |
| 4,816,962 | 3/1989 | Yamada et al. ..................... 361/141 |

FOREIGN PATENT DOCUMENTS

| 0154996 | 9/1985 | European Pat. Off. . |
| 0160350 | 11/1985 | European Pat. Off. . |
| 0162369 | 11/1985 | European Pat. Off. . |
| 0219013 | 4/1987 | European Pat. Off. . |
| 17230761 | 8/1986 | Japan . |
| 1135332 | 12/1968 | United Kingdom . |
| 2168852 | 6/1986 | United Kingdom . |

OTHER PUBLICATIONS

Navarov et al., "Compensators for Non-Uniformity of the Magnetic Field of a Superconducting Solenoid", Cryogenics, Dec. 1972, pp. 470-471.

Zabrodin et al., "The Elimination of Side Bands Resulting from Rotation of the Specimen in a High Resolution Spectrometer with a Superconducting Magnet", Cryogenics, Sep. 1973, pp. 554-555.

Primary Examiner—M. H. Paschall
Assistant Examiner—Jeffrey A. Gaffin
Attorney, Agent, or Firm—Bernard, Rothwell & Brown

[57] ABSTRACT

A magnetic field compensating apparatus having a plurality of compensating units comprising a plurality of serial coils each of which is disposed concentrically along the main magnetic field and symmetrically with regard to a plane perpendicular to the main magnetic field and a plurality of power sources which separately supply currents to these compensating units, and made in such a manner that a plurality of error magnetic field components are generated by each of the compensating units, a compensating magnetic field is obtained by the whole of a plurality of the compensating units, and each of the currents supplied to the compensating units is decided in accordance with a constitution of a corresponding compensating unit.

6 Claims, 2 Drawing Sheets

MAGNETIC FIELD COMPENSATING APPARATUS

BACKGROUND OF THE INVENTION

1. Field of the Invention

This invention relates to a magnetic field compensating apparatus which compensates a radial direction component of an error magnetic field contained in a magnetic field produced by a main coil of a magnet device used for a magnetic resonance apparatus, and particularly to a small-sized, inexpensive and highly accurate magnetic field compensating apparatus.

2. Prior Art

In general, uniformity of magnetic field in a region in which an object to be examined is installed is one of important characteristics in a superconductive-type magnetic resonance apparatus. Accordingly, with respect to a main coil for generating an output magnetic field from a magnet device used for a magnetic resonance apparatus, various ideas are applied to its shape, its current distribution and the like in order to make a magnetic field highly uniform.

But, a highly uniform magnetic field is liable to be disturbed by internal conditions of the magnet such as accuracy in manufacturing and a temperature condition or environmental conditions such as a ferromagnetic substance disposed near the magnet. Until now, therefore, a magnetic field compensating apparatus for compensating an error magnetic field has been built in a magnetic field resonance apparatus.

The component $B(X,Y,Z)$ of the error magnetic field can be represented by the following Maclaurin expansion of the output of the magnetic field at the center point of the magnetic field.

$$B(X,Y,Z) = \sum_{k=0}^{\infty}(X\partial/\partial X + Y\partial/\partial Y + Z\partial/\partial Z)^k B(O,O,O)/k! \quad (1)$$

$$= B_0 + B_1X + B_2Y + B_3Z + B_4X^2 + B_5Y^2 +$$

$$B_6Z^2 + B_7XY + B_8YZ + B_9ZX + \ldots$$

Here, $B_0$ shows a necessary component of the uniform magnetic field, and $B_1X$, $B_2Y$, and $B_3Z$ represent the first order error magnetic field components toward the X, Y, and Z directions, respectively. And the following of $B_1X$, $B_2Y$ and $B_3Z$ show components of higher order error magnetic field components in order.

In the case where the main magnetic field generated by the main coil is directed toward the Z direction, error magnetic field components containing X and/or Y (For example, $B_1X$, $B_2Y$, $B_1X^2$, $B_5Y^2$, $B_7XY$, $B_8YZ$, $B_9ZX$, —) are called radial direction error magnetic field components.

Until now, compensation of radial direction error magnetic field components has been performed for each component. Accordingly, when compensation is performed using, for example, coils, such a series of independent coils corresponding to each component as an X compensating coil (X-sim coil), a Y compensating coil (Y-sim coil), a XY compensating coil (XY-sim coil)-,—are employed.

FIG. 1 is a block diagram showing a X compensating coil in a conventional magnetic field compensating apparatus. In the diagram, numerals 11 through 14 show four saddle-shaped coils which are installed cylindrically and disposed along the Z direction. These coils 11 through 14 compose a family of coils of one unit, and they are series connected with each other to be driven by one power source (not shown). An arrow i, a character a, and a character $\theta$ show a current flowing in the coils 11 through 14, a radius of arc sections of the coils 11 through 14, and an angular aperture of the arc sections, respectively.

The actual magnetic field compensating apparatus has a multi-layer construction in which other cylindrical compensating coils (not shown) are piled up and disposed concentrically in order on the family of coils shown in FIG. 1 in order to compensate error magnetic field components in the above-mentioned other radial directions (For example, a $Z^2X$ component, an $X^3$ component, etc.). Since a family of coils for compensating the higher order components of the error magnetic field such as the $Z^2X$ component, the $X^3$ component, etc. are provided with 6 to 8 saddle-shaped coils, 18 or more saddle-shaped coils are usually needed in order to perform magnetic field compensation for three components containing the X component.

FIG. 2 is a sectional view, taken along the line 2—2 of FIG. 3, showing an example of a superconductive magnet around which the X compensating coil shown in FIG. 1 is actually disposed together with other compensating coils (Y, Z, ZX, XY, —). FIG. 3 is a sectional view looking in the direction of the arrows 3—3 in FIG. 2.

In the views, numerals 30, 31, and 32 are opening of a superconductive coil, a superconductive main magnet, and a compensating coil which is manufactured as a superconductive coil and installed concentrically with the superconductive main coil 31, respectively. The structure indicated by numerals 33, 34, and 35 includes a liquid helium tank 34 which contains the superconductive main coil 31 and the compensating coil 32 and comprises a thermal shield 33, liquid helium tank 34, and a vacuum tank 35 which covers the liquid helium tank 34. A numeral 36 is a compensating coil which is manufactured as an ordinary conductive coil and disposed in the opening 30. In some apparatus both compensating coils 32 and 36 are installed; in other apparatus only one of them is installed.

Next, there will be given description of compensating operation for an error magnetic field in the Z direction using the X compensating coil shown in FIG. 1. A magnetic field component which compensates the error magnetic field in the Z direction is generated by only the arc section among the arc section and the linear section which form each of the saddle-shaped coils 11 through 14. The expression which represents the magnetic field output $B_z(x,y,z)$, is as follows.

$$B_z(x,y,z) = x\partial B_z/\partial x + (x^3/6)\partial^3 B_z/\partial x^3 + \quad (2)$$

$$(xy^2/2)\partial^3 B_z/\partial x\partial y^2 + (xz^2/2)\partial^3 B_z/\partial x\partial z^2 + (x^5/120)\partial^5 B_z/\partial x^5 +$$

$$(x^3y^2/12)\partial^5 B_z/\partial x^3\partial y^2 + (xy^4/24)\partial^5 B_z/\partial x\partial y^4 +$$

$$(x^3z^2/12)\partial^5 B_z/\partial x^3\partial z^2 + (xy^2z^2/4)\partial^5 B_z/\partial x\partial y^2\partial z^2 +$$

$$(xz^4/24)\partial^5 B_z/\partial x\partial z^4 + \ldots$$

The expression (2) represents outputs of the first order, the third order and up to the fifth order, and neglects outputs of much higher orders.

In case of the X compensating coil, the first term of the first order in the expression (2) is an effective one, and the term of the third order, the term of the fifth order and terms of orders higher not less than the fifth order become errors for compensation. When the partial derivatives in the expression (2) are represented concretely, they can be represented by the radius a, the angular aperture θ of the arc section and the position in the Z direction where the arc section is disposed. In the X compensating coil, therefore, proper values are selected for the position in the Z direction and the angular aperture θ of the arc section, and the term of the third order (or terms of orders not less than the fifth order) in the expression (2) is (or are) eliminated as the total sum of the eight arc sections of respective saddle-shaped coils 11 to 14.

Accordingly, in order to make other components small, the position in the Z direction is limited, and at the same time, the angular aperture θ is limited and can not be made large. As a result, compensating magnetic field components per ampereturn are made small.

As described above, a conventional magnetic field compensating apparatus has had the following problems. Since it performs error magnetic field compensation in the radial direction for only one component (For example, an X component), the position in the Z direction of the arc section of the compensating coil, the angular aperture θ thereof, and the like are limited in order to make other components zero or sufficiently small. Accordingly, compensating magnetic field components per ampereturn are made small, thereby decreasing the degree of accuracy of the apparatus. Furthermore, in the compensating coil for higher order error components of the main coil, the number of the saddle-shaped coils and the number of layers thereof are increased, thereby making the apparatus larger in size and, at the same time, making it expensive.

SUMMARY OF THE INVENTION

The object of the present invention is to obtain a highly accurate magnetic field compensating apparatus which is made small in size and inexpensive by decreasing the number of saddle-shaped coils and the number of layers thereof and, at the same time, is capable of generating the compensating magnetic field component with few ampere-turns.

A magnetic resonance apparatus relating to the present invention is provided with a plurality of compensating units composed of a plurality of coils connected in series each of which is disposed concentrically along a main magnetic field and symmetrically with regard to a plane perpendicular to the main magnetic field and a plurality of power sources for separately supplying currents to these compensating units.

Accordingly, each of the compensating units contains a plurality of components among error magnetic fields in the radial direction. These components are compensated simultaneously by the whole of the plural compensating units, and each current in each compensating unit is decided in accordance with the constitution thereof, thereby performing current adjustment in each compensating unit.

DETAILED DESCRIPTION OF THE PREFERRED EMBODIMENT

Figure 1:
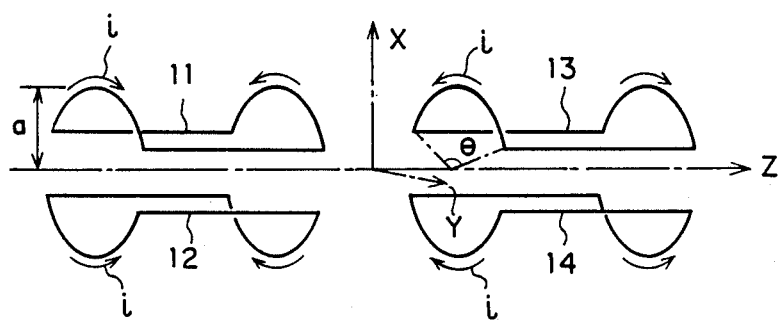
FIG. 1 is a schematic diagram showing a conventional magnetic field compensating apparatus.
Figure 3:
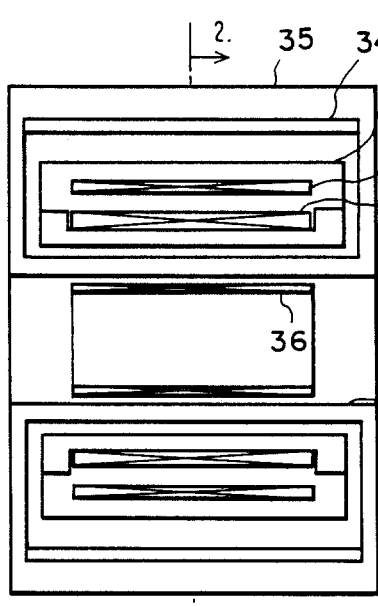
FIG. 3 is a sectional view looking in the direction of the arrows 3—3 in FIG. 2.
Figure 2:
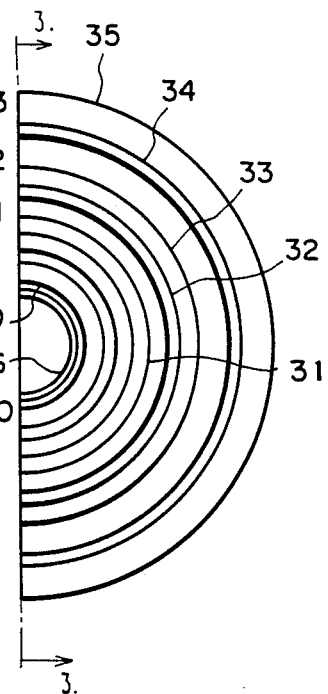
FIG. 2 is a sectional side view, taken along the line 2—2 of FIG. 3, showing a construction of a general superconductive magnet.
Figure 4:
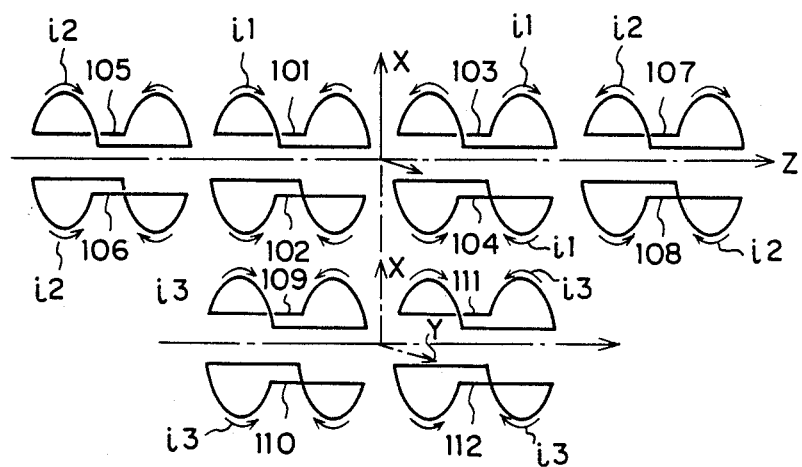
FIG. 4 is a schematic diagram showing an embodiment according to the present invention.
Figure 5:
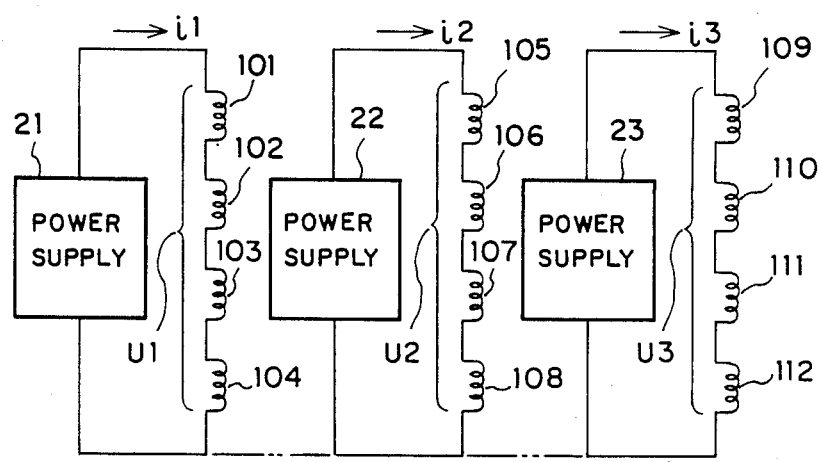
FIG. 5 is a block diagram showing a constitution of a power source for the family of coils shown in FIG. 4.

Hereinafter, an embodiment according to the present invention will be described with reference to drawings. FIG. 4 is a schematic diagram showing an embodiment according to the present invention. FIG. 5 is a block diagram showing a constitution of a power source for the family of coils shown in FIG. 4. A constitution of a superconductive magnet around which the family of coils are disposed is as shown in FIG. 2 and FIG. 3. Here is shown the case where X, $Z^2X$, and $X^3$ components among error magnetic field components of the main coil are compensated.

In the drawings, numerals 101 through 112 show twelve saddle-shaped coils disposed along the Z direction, respectively. The coils 101 through 104, the coils 105 through 108, and the coils 109 through 112 constitute a first compensating unit U1, a second compensating unit U2 and a third compensating unit U3, respectively. Coils 101 through 104, 105 through 108 and 109 through 112 have not been illustrated in FIG. 4 as connected in series because showing such connections would have unduly cluttered that figure and would have obscured the relationship intended to be illustrated in that figure. However, the series connections are shown in the circuit of FIG. 5.

The saddle-shaped coils 105 through 108 of the second compensating unit U2 are disposed pair by pair on both sides of the saddle-shaped coils 101 through 104 of the first compensating unit U1. The respective saddle-shaped coils 109 through 112 of the third compensating unit U3 shown in the under stage for the sake of convenience are concentrically piled and disposed in practice so as to make their X, Y, and Z directions coincide with those of the respective saddle-shaped coils 101 through 104 of the first compensating unit U1.

Accordingly, the saddle-shaped coils 101 through 112 are disposed so as to be symmetrical with regard to the XY plane perpendicular to the Z (main magnetic field) direction respectively for each of the compensating units U1 through U3.

Arrows i1 through i3 show currents flowing in the saddle-shaped coils 101 through 112 in the respective compensating units U1 through U3, and numerals 21 through 23 show three power sources for separately supplying currents to the respective compensating units U1 through U3.

Next, the operation of the embodiment will be described.

When the saddle-shaped coils 101 through 112 are excited by the power sources 21 through 23, magnetic field outputs are generated from the respective compensating units U1 through U3. Magnetic field outputs generated in the axial direction composed of the sum of these magnetic field outputs are divided into three compensating magnetic field components, namely, $B_z(X$ component), $B_z(Z^2X$ component), and $B_z(X^3$ component), which are represented from the expression (2) as follows.

$B_z(X$ component) $= x(\partial B_z/\partial x)_1(AT1) +$ $x(\partial B_z/\partial x)_2(AT2) + x(\partial B_z/\partial x)_3(AT3)$ -continued $$B_z(Z^2X \text{ component}) = (z^2x/2)(\partial^3 B_z/\partial x \partial z^2)_1(AT1) +$$
$$(z^2x/2)(\partial^3 B_z/\partial x \partial z^2)_2(AT2) + (z^2x/2)(\partial^3 B_z/\partial x \partial z^2)_3(AT3)$$

$$B_z(X^3 \text{ component}) = (x^3/6)(\partial^3 B_z/\partial x^3)_1(AT1) +$$
$$(x^3/6)(\partial^3 B_z/\partial x^3)_2(AT2) + (x^3/6)(\partial^3 B_z/\partial x^3)_3(AT3)$$

Here, subscripts 1 through 3 show a component of compensating units U1 through U3, and abbreviations AT1 through AT3 show ampereturns in the saddle-shaped coils in the compensating units U1 through U3. Arranging these expressions, the required magnetic field is represented by the following expression (3).

$$\begin{bmatrix} B_z(X \text{ component}) \\ B_z(Z^2X \text{ component}) \\ B_z(X^3 \text{ component}) \end{bmatrix} = \begin{bmatrix} x(\partial B_z/\partial x)_1, x(\partial B_z/\partial x)_2, x(\partial B_z/\partial x)_3 \\ (z^2x/2)(\partial^3 B_z/\partial x \partial z^2)_1, (z^2x/2)(\partial^3 B_z/\partial x \partial z^2)_2, \\ (z^2x/2)(\partial^3 B_z/\partial x \partial z^2)_3 \\ (x^3/6)(\partial^3 B_z/\partial x^3)_1, (x^3/6)(\partial^3 B_z/\partial x^3)_2, \\ (x^3/6)(\partial^3 B_z/\partial x^3)_3 \end{bmatrix} \times \begin{bmatrix} AT1 \\ AT2 \\ AT3 \end{bmatrix} \quad (3)$$

In other words, it is represented by the product of the matrix decided by the construction of the family of coils and the matrix decided by ampereturns. By making an inverse matrix of the first term in the right side of the expression (3), current values of the respective power sources 21 through 23 for compensation, which correspond to three components of error magnetic fields produced by main coils, can be set.

In this way, if a system which compensates magnetic field error components of a plurality of main coils using one compensating unit is adopted, the fixed compensation for magnetic field error components of the main coil is performed with other compensating units, and current values are adjusted for the whole of the compensating units, the position of the arc section in the Z direction and the angular aperture thereof can be set most properly. As a result, the limitation on the construction can be alleviated.

Accordingly, according to the constitution of the present invention, this magnetic field compensating apparatus has merits described in following terms (i) through (iii).

(i) The above-mentioned three magnetic field components can be compensated by only twelve saddle-shaped coils 101 through 112, thereby allowing the number of saddle-shaped coils and the number of layers of the coils to be reduced.

(ii) Since the conditions for the position in the Z direction and the angular aperture $\theta$ are alleviated, a saddle-shaped coil having a high sensitivity for magnetic field outputs can be manufactured, thereby allowing light weight of the apparatus and reduction in voltages and currents of the power source.

(iii) Since magnetic field compensation is performed by the whole of a plurality of the compensating units U1 through U3, magnetic field characteristics are improved and an apparatus having a high output accuracy can be obtained by a combination of the compensating units U1 through U3.

Though, in the above-mentioned embodiment, a family of coils which generates the X component, the $Z^2X$ component, and the $X^3$ component have been described as an example, the present invention can be, of course, embodied with the same constitution using a family of coils which generates the Y component, the $Z^2Y$ component, and the $Y^3$ component. These components may be combined with other magnetic field components using a combination of a coil system and compensating units.

Furthermore, though the construction was made of two-layers by arranging the third compensating unit U3 as the other layer, the construction may be made of a single layer by extending a layer which contains the first compensating unit U1 toward the Z direction to form the same layer.

The present invention as described above has an effect that a magnetic field compensating apparatus which is capable of reducing the number of coils and the number of layers of the coils, generating compensating magnetic field components with a small amount of ampereturn, and having a small size, light weight, low cost, and high accuracy in outputs can be obtained, because the apparatus is provided with a plurality of compensating units comprising a plurality of coils connected in series each of which is disposed concentrically along the main magnetic field and symmetrically with regard to a plane perpendicular to the main magnetic field and a plurality of power sources which separately supply currents to these compensating units, and made in such a manner that a plurality of error magnetic field components are generated by each of the compensating units, a compensating magnetic field is obtained by the whole of a plurality Of the compensating units, and, at the same time, each of the currents supplied to the compensating units is decided in accordance with a constitution of each of the compensating units.

What is claimed is:

1. A magnetic field compensating apparatus for compensating error magnetic fields in the radial direction of a magnet apparatus used for a magnetic resonance apparatus comprising:

a plurality of compensating units comprising a plurality of serial coils each of which is disposed concentrically along a main magnetic field and symmetrically with regard to a plane perpendicular to said main magnetic field, a plurality of power sources which separately supply currents to these compensating units, and made in such a manner that a plurality of components among said error magnetic fields in the radial direction are contained in each of said compensating units, a plurality of said components are compensated by the whole of a plurality of said compensating units, and, at the same time, each of said currents supplied to said compensating units is decided in accordance with a constitution of each of said compensating units, said plurality of said compensating units comprising a first compensating unit composed of four saddle-shaped coils disposed cylindrically, a second compensating unit composed of four saddle-shaped coils disposed cylindrically pair by pair on both sides of the first compensating unit, and a third compensating unit composed of four saddle-shaped coils piled and disposed concentrically on each of said saddle-shaped coils of said first compensating unit.

2. A magnetic field compensating apparatus according to claim 1, wherein the coil in each of said compensating units is a superconductive coil.

3. A magnetic field compensating apparatus according to claim 1, wherein the coil in each of said compensating units is an ordinary conductive coil.

4. A magnetic field compensating apparatus for compensating error magnetic fields in the radial direction of a magnet apparatus used for a magnetic resonance apparatus comprising:

a plurality of compensating units comprising a plurality of serial coils each of which is disposed concentrically along a main magnetic field and symmetrically with regard to a plane perpendicular to said main magnetic field, a plurality of power sources which separately supply currents to these compensating units, and made in such a manner that a plurality of components among said error magnetic fields in the radial direction are contained in each of said compensating units, a plurality of said components are compensated by the whole of a plurality of said compensating units, and, at the same time, each of said currents supplied to said compensating units is decided in accordance with a constitution of each of said compensating units, said plurality of said compensating units comprising a first compensating unit composed of four saddle-shaped coils disposed cylindrically and second and third compensating units each of which is composed of four saddle-shaped coils disposed cylindrically pair by pair on both sides of the compensating unit.

5. A magnetic field compensating apparatus according to claim 4, wherein the coil in each of said compensating units is a superconductive coil.

6. A magnetic field compensating apparatus according to claim 4, wherein the coil in each of said compensating units is an ordinary conductive coil.

* * * * *

UNITED STATES PATENT AND TRADEMARK OFFICE
CERTIFICATE OF CORRECTION

PATENT NO. : 4,945,446
DATED : July 31, 1990
INVENTOR(S) : SHIGENORI KURODA ET AL.

It is certified that error appears in the above-identified patent and that said Letters Patent is hereby corrected as shown below:

Column 2, line 30, delete "mag-";
line 31, "net" should be --coil--.

Column 3, line 63, start a new paragraph with "FIG. 2".

Column 6, line 36, "Of" should be --of--.

Signed and Sealed this

Thirty-first Day of March, 1992

Attest:

HARRY F. MANBECK, JR.

*Attesting Officer*     *Commissioner of Patents and Trademarks*